United States Patent
Winslow et al.

(10) Patent No.: US 6,803,817 B2
(45) Date of Patent: Oct. 12, 2004

(54) DUAL BAND POWER AMPLIFIER WITH IMPROVED ISOLATION

(75) Inventors: Thomas A. Winslow, Salem, VA (US); Xinjian Zhao, Roanoke, VA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/366,062

(22) Filed: Feb. 12, 2003

(65) Prior Publication Data

US 2004/0155706 A1 Aug. 12, 2004

(51) Int. Cl.$^7$ ............................................... H03F 3/191
(52) U.S. Cl. ....................................... 330/126; 330/302
(58) Field of Search ............................ 330/65, 66, 67, 330/68, 124 R, 126, 302, 306, 307

(56) References Cited

U.S. PATENT DOCUMENTS 6,188,877 B1 * 2/2001 Boesch et al. ................ 455/74

* cited by examiner

Primary Examiner—Steven J. Mottola

(57) ABSTRACT

The invention is a dual band power amplifier with a small footprint having excellent band-to-band isolation. An improved second and fourth harmonic trap at the output of the low band power amplifier comprises a first capacitance shunted to ground placed in series with an inductance, the inductance preferably in the form of a transmission line of predetermined length, and a second capacitance coupled between an intermediate point of the transmission line inductance and ground. Band-to-band isolation can be additively increased by further forming a ground loop between the outputs of the two power amplifiers. The ground loop further isolates the high band amplifier from the low band amplifier by causing the magnetic fields generated around the output wire bonds of the low band power amplifier to set up circulating currents primarily in the ground loop, rather than coupling into the output wire bonds of the high band power amplifier.

20 Claims, 7 Drawing Sheets

DUAL BAND POWER AMPLIFIER WITH IMPROVED ISOLATION

FIELD OF THE INVENTION

The invention pertains to dual band power amplifiers such as those commonly employed in dual mode digital cellular telephones. More particularly, the invention pertains to a method, apparatus and technique for improving isolation between two physically adjacent amplifiers operating at different frequencies.

BACKGROUND OF THE INVENTION

In cellular telephones and other electronic devices, it is often necessary for two power amplifiers operating on signals of different frequencies to be positioned very close to one another. For example, a dual mode, dual band digital cellular telephone is an example of one such component. Particularly, in the U.S., Europe, Japan, and other countries, the governments have assigned at least two frequency bands for digital cellular telephone communications. In the U.S. for instance, a first band, called the American Mobile Phone System or AMPS band, has been assigned at 824–849 MHz and a second band, called the Personal Communications System or PCS band has been assigned at 1850–1910 MHz. In Europe on the other hand, a first band called the Global System for Mobile Communications or GSM band has been assigned at 880–915 MHz and a second band, called the Digital Communications System or DCS band has been assigned at 1710–1785 MHz. Accordingly, dual band digital cellular telephones typically have two power amplifiers, one for each of the two bands. Note that, in both the U.S. and Europe, the higher frequency band is at about twice the frequency of the lower frequency band. Thus, in both the U.S. and Europe, the second harmonic of the lower frequency band is very close in frequency to the fundamental frequency of the higher frequency band.

In accordance with the ever-present desire to miniaturize most electronic devices, including cellular telephones, there is pressure to place the two power amplifiers physically very close to one another. When the conductors carrying the output signals of two amplifies are placed near each other, the output signals tend to magnetically couple to each other. If the frequency of the output signals of the higher frequency (high band) power amplifier is near a harmonic of the frequency of the output signals of the lower frequency (low band) power amplifier, spurious signals at the second harmonic of the lower frequency band that are generated at the output of the low band power amplifier that couple into the output of the high band power amplifier can be a problem. Specifically, these spurious signals that couple into the output conductors of the high band amplifier will bleed right through the filters and/or duplexers downstream of the high band power amplifier, reach the antenna, and be transmitted. Such high power spurious transmissions are, of course, undesirable. In fact, there are regulations regarding the maximum allowable spurious emissions for cellular telephones and other wireless devices. Further, the fourth harmonic of the low band power amplifier will be very close in frequency to the second harmonic of the high band power amplifier, which can also be a problem.

Several techniques have been tried to improve isolation of the two power amplifier bands within cellular telephones and other electronic devices. Probably the simplest technique is to provide as much physical separation between the two power amplifiers as possible. However, as noted above, cellular telephones, and particularly their electronic components, have become so small and the pressure remains to make them even smaller that increasing physical separation generally is not an acceptable solution. Another technique employed to maximize low band to high band power amplifier isolation involves using a second harmonic trap on the output of the lower band power amplifier to cancel second harmonic signals at the output of the low band power amplifier. It has been found, however, that there still tends to be quite a bit of second harmonic signal from the low band power amplifier coupling into the higher band power amplifier even with a second harmonic trap.

Another technique that has been used to improve isolation involves making the output conductors of one of the power amplifiers orthogonal to the output conductors of the other power amplifier. Thus, the magnetic field lines of the output signals of the low band power amplifier are orthogonal to the output wire bonds of the high band power amplifier so that they do not couple to each other as readily. However; this solution has some practical problems. Particularly, the power amplifiers are typically mounted on a printed circuit board or other substrate containing other RF driver and power control circuitry to which the power amplifiers must be coupled electrically. For instance, the outputs of the power amplifiers typically must be coupled to separate filters and/or duplexers or a diversity switch and then to the same antenna. Accordingly, it is often desirable for the input and output conductors of the two amplifiers to be parallel and/or adjacent to each other to shorten and/or simplify the conductor traces that must be placed on the printed circuit boards in order to carry the output signals to their ultimate destination, i.e., the same antenna. Making the output conductors of the two amplifiers orthogonal to each other can significantly complicate the design and layout realization of conductor traces on the substrate and increases the necessary size of the board.

Typical dual band power amplifier circuitry for cellular telephones and the like commonly are available in LTCC form, FR-laminate module form, or a large plastic molded package. Dual band power amplifier circuits available on the market today typically yield isolation power levels of about −25 dBm to −20 dBm. It would be desirable to attain better isolation.

Accordingly, it is an objective present invention to provide an improved dual band power amplifier.

It is another objective present invention to provide a dual band power amplifier with improved isolation between the two amplifiers.

SUMMARY OF THE INVENTION

The invention is a dual band power amplifier with a small footprint and having excellent band-to-band isolation. There are several aspects of the present invention that, acting together, maximize low-band-to-high-band isolation. The first and primary aspect is a dual frequency (second and fourth harmonic) trap at the output of the low band power amplifier comprising a first series capacitance, preferably, on the power amplifier chip, in series with an inductance, the inductance preferably in the form of a transmission line of predetermined length, and further including a second capacitance coupled between an intermediate point of the transmission line inductance and ground. This LC circuit forms a dual resonant second and fourth harmonic trap that provides a very low impedance at the output of the power amplifier at the second and fourth harmonics of the low band power amplifier. This type of harmonic trap substantially increases the band-to-band isolation comparative to a conventional second harmonic trap.

Band-to-band isolation can be additively increased by further forming a ground loop between the output conductors of the two power amplifiers. The ground loop is formed by using a looping wirebond that spans from one grounded location to another location positioned between the parallel output wirebonds of the high and low band power amplifiers. The ground loop further isolates the high band amplifier from the low band amplifier by causing the magnetic fields generated around the output wire bonds of the low band power amplifier to set up circulating currents primarily in the ground loop, rather than coupling into the output wire bonds of the high band power amplifier.

The invention finds particular use in cellular telephones for CDMA, TDMA and GSM. systems.

DETAILED DESCRIPTION OF THE INVENTION

Figure 1:
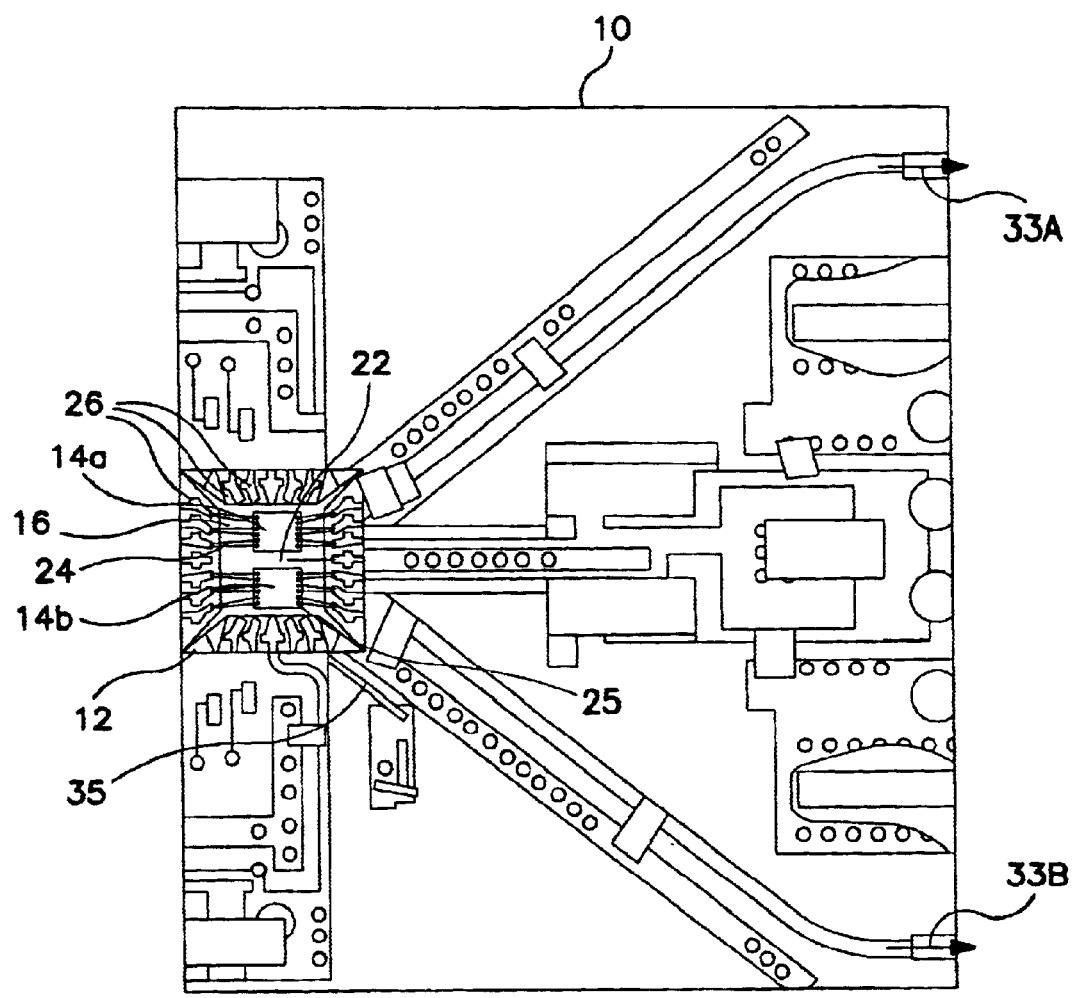
FIG. 1 is a plan view of a printed circuit board of a dual band power amplifier within which the present invention can be employed.

FIG. 1 is a plan view of a printed circuit board (PCB) 10 bearing a dual band power amplifier circuit. It includes an integrated circuit (IC) chip carrying plastic molded package (familiar to anyone skilled in the art) containing a dual band power amplifier configuration in which the present invention may be implemented. Each amplifier is on a separate die 14a, 14b with both dies mounted to a single lead frame 16. However, this is merely exemplary and both amplifiers may be formed on a single die. Furthermore, while the dual band power amplifier of this exemplary embodiment is embodied on a FR-4 based PCB, this is merely exemplary and the present invention is essentially independent of the particular substrate used. Most dual or multiband power amplifier circuits presently available on the market are single package units of LTCC, FR4/laminate or a large plastic package.

Again, merely as an example, the low band power amplifier 14a may be adapted to amplify signals in the AMPS frequency band and the high band power amplifier 14b may be adapted to amplify signals in the PCS band.

As is conventional, the lead frame comprises a central ground plane 22, on which the dies 14a, 14b are mounted, and a plurality of lead fingers 26 extending therefrom. Electrical signals on the dies, such as the outputs of the amplifiers, are routed to bond pads 25 on the top surfaces of the dies. The bond pads are electrically coupled to appropriate ones of the lead fingers by conventional bond wires 24. The distal ends of the lead fingers 26 are attached to conductors on the printed circuit board 10 that carry the signals to/from other circuitry on the printed circuit board and/or to edge connectors or other connectors on the PCB 10 for coupling to circuitry external of the PCB.

Figure 2:
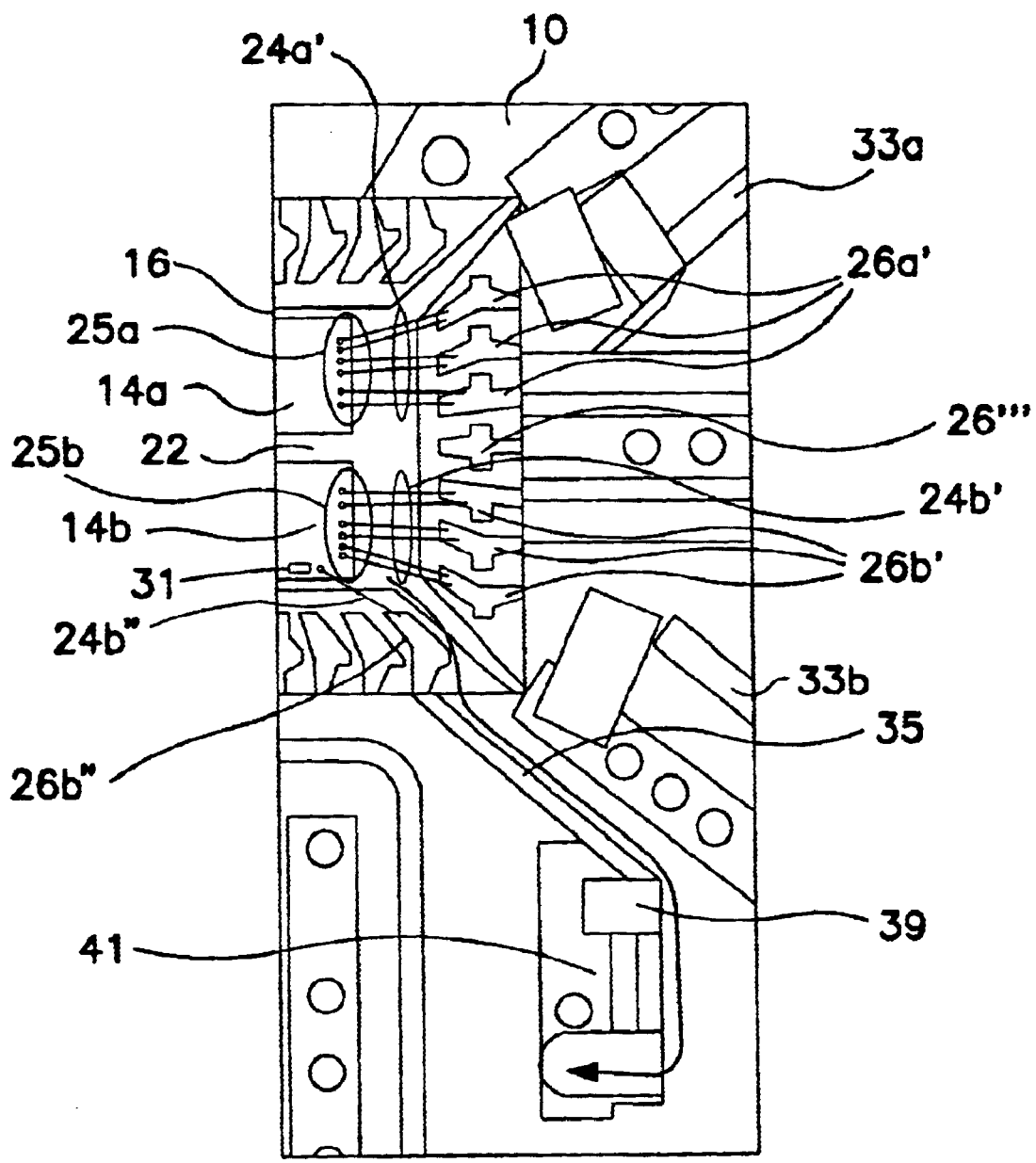
FIG. 2 is a close up plan view of a portion of the printed circuit board shown in FIG. 1.

In one preferred embodiment of the invention, the IC 12 is only 4 to 5 mm square. Accordingly, the two power amplifiers are extremely close to one another physically. In this particular embodiment, as best seen in FIG. 2, which is a close up of a portion of the PCB, the output signal from each amplifier is split among a plurality of bond pads, bond wires and lead fingers since the total current in the output signals is quite high and could not be transported effectively via a single bond wire. Specifically, on the dies 14a, 14b, the output signal is routed to six cojoined bond pads on each die 14a, 14b (labeled 25a' and 25b', respectively, in FIG. 2 in order to differentiate from other bond pads 25). The bond pads 25a', 25b' are wire bonded via six bond wires (labeled 24a', 24a' in FIG. 2 in order to differentiate from other bond wires 24) to three lead finger (labeled 26a', 26b' in FIG. 2 in order to differentiate from the other lead fingers 26) on the lead frame 16. Accordingly, for each amplifier 14a, 14b, there are six parallel and adjacent bond wires 24a', 24b' carrying the output signal to three lead fingers 26a', 26b'. The three output fingers 26a', 26b' of each amplifier 14a, 14b are coupled to electrical contact points on the PCB 10 and recombined in a large trace 33a, 33b, respectively, that carries the output signals to conditioning circuitry such as filters and duplexers (not shown). After the conditioning circuitry, the signals are sent via further traces on the PCB, edge connectors and/or other conductors to an antenna (none of which is shown in the Figures).

Figure 3:
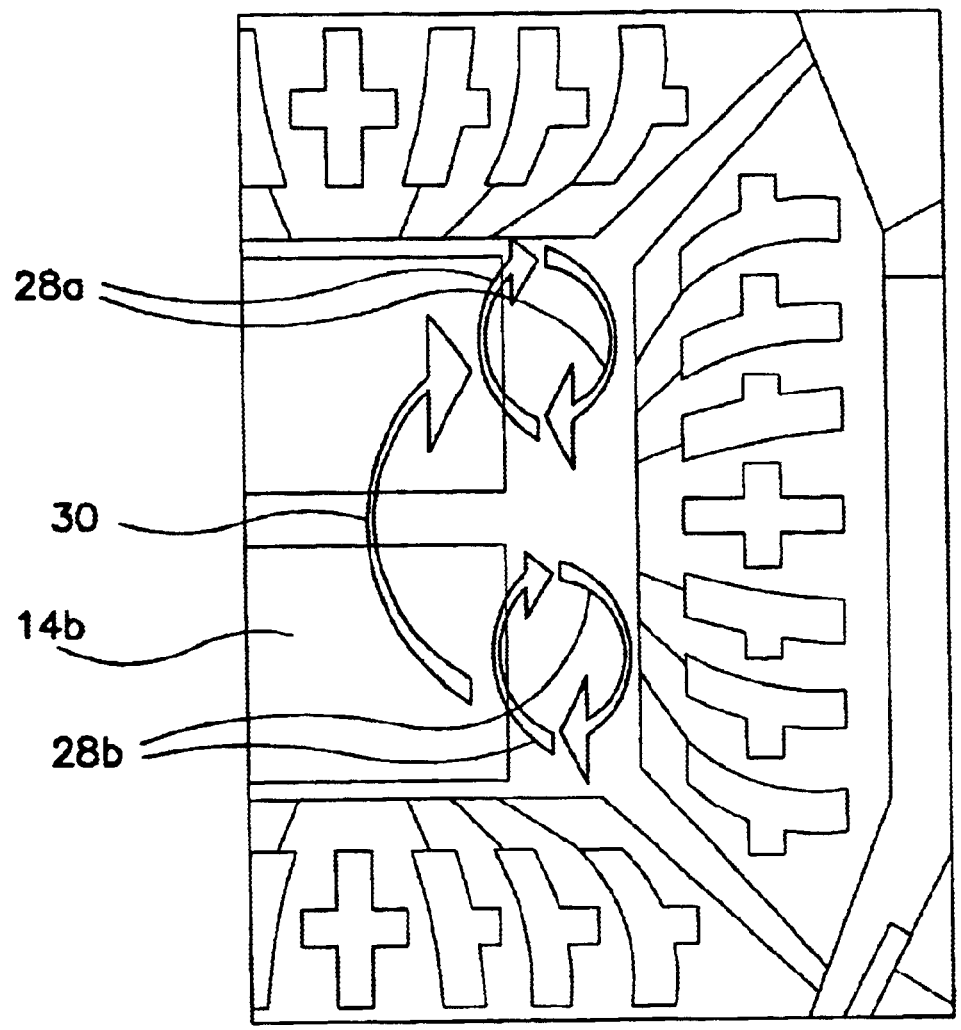
FIG. 3 is another plan view of a portion of the printed circuit board of FIG. 1 schematically illustrating magnetic coupling between the output conductors of the amplifiers.

As can be seen in FIG. 2, the six bond wires 24a' for the output of amplifier 14a are parallel and close to the six bond wires 24b' for the output of amplifier 14b. We have determined that the undesirable magnetic coupling of output signals of the low band amplifier 14b to the output conductors of the high band amplifier occurs primarily, if not exclusively, in the bond wires. As illustrated in FIG. 3, circulating magnetic fields represented by arrows 28b are set up in and around the bond wires of the low band power amplifier 14b. Similar circulating magnetic fields 28a are set up around the wire loops for the high band power amplifier 14a. Time varying magnetic fields containing the second and fourth (as well as other) harmonics of the main signal being amplified by the low band amplifier 14b can couple to the bond wires 24a' of the high band power amplifier 14a, as illustrated by arrow 30, thus causing all of the aforementioned deleterious effects.

In accordance with one aspect of the present invention, a harmonic trap is coupled to the output of the low band power amplifier 14b to short out signals at at least the second harmonic frequency of the low band amplifier 14b to help isolate them from the high band power amplifier 14a.

Figure 4:
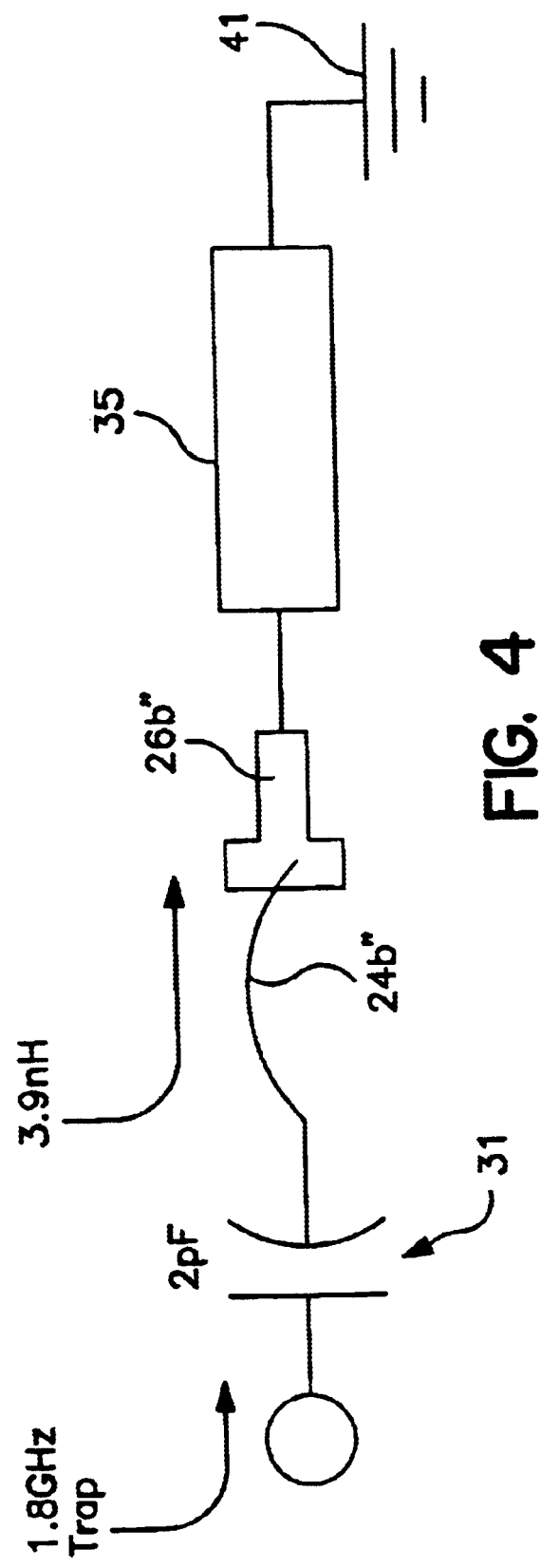
FIG. 4 is a circuit diagram of a second harmonic trap in accordance with one embodiment of the present invention.

FIG. 4 is a schematic circuit diagram of an exemplary second harmonic trap in accordance with the present invention that improves isolation between the two amplifiers. The actual physical components corresponding to the circuit components shown schematically in FIG. 4 can be seen in FIG. 2 and are indicated with the same reference numerals. The trap includes a capacitor 31 formed on the low band power amplifier die 14b and electrically coupled to the output signal of low band amplifier 14b directly before the output bond pads 25b' and bond wires 24b' that carry the output signal off die. The output signal of the low band amplifier 14b is coupled through capacitor 31 via a pad (not labeled) and bond wire 24b''' to another lead finger 26b'' to a tuned, narrow, inductive transmission line 35 formed on the PCB 10. The transmission line 35 should have a high Q and be precisely tuned in length to resonate with the on-chip capacitance 31 at the second harmonic frequency of the low band power amplifier. The particular capacitance and inductance values are selected to resonate and trap signals at the determined frequency, i.e., the second harmonic of the frequency band of the low band amplifier 14b.

The far end of the transmission line 35 is coupled to the ground plane of the PCB.

In this particular embodiment in which the fundamental frequency of the low band amplifier 14b is about 900 MHz and the desired trap frequency is the second harmonic frequency of about 1.8 GHz, the capacitor 31 is about 2 pF, and the transmission line 35 is about 200 mils in length and 8 mils in width to provide an inductance of about 3.9 nH.

The harmonic trap shorts much of the signal at the second harmonic frequency of the low band amplifier 14b to ground. However, some of the signal at the second harmonic still exists on the bond wires 24b' of the low band amplifier 14b and can bleed through to the output of the high band amplifier via the aforementioned magnetic coupling at the bond wires.

Figure 5:
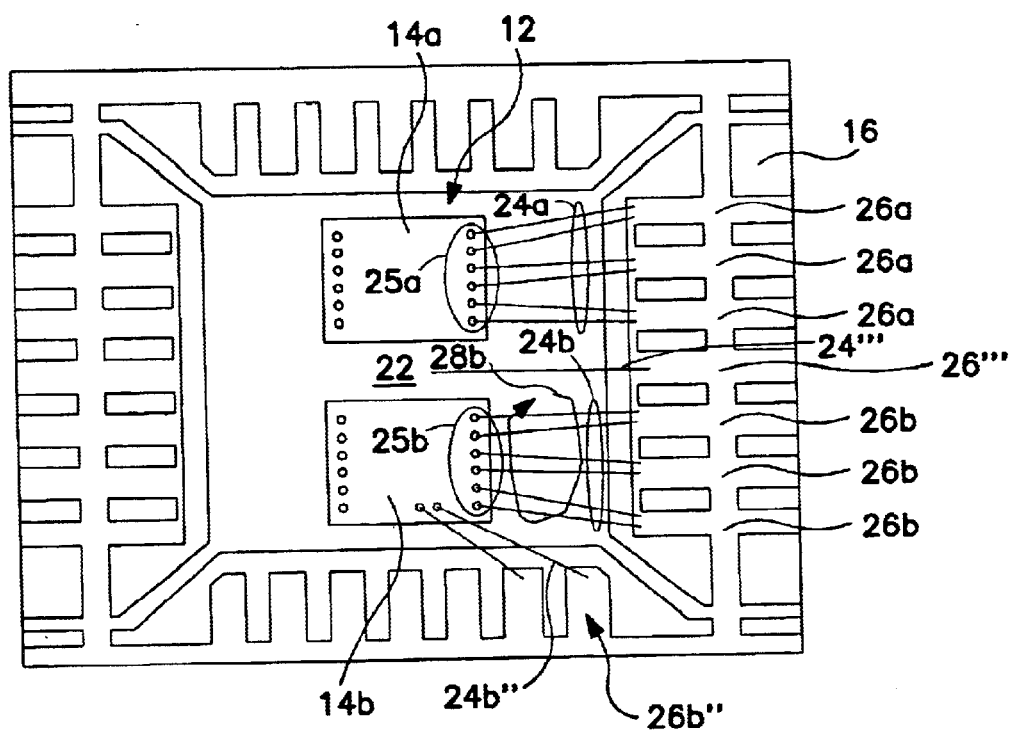
FIG. 5 is a plan view of a portion of the printed circuit board of FIG. 1 showing a ground loop in accordance with the present invention.

Hence, in accordance with the second aspect of the invention, a ground loop is placed between the output conductors of the two amplifiers 14a, 14b. FIG. 5 is a plan view of a portion of the PCB illustrating one particular embodiment of a ground loop in accordance with the present invention. Particularly, a PCB grounded lead finger 26''' is positioned between the three lead fingers 26a' carrying the output of the high band amplifier 14a and the three lead fingers 26b' carrying the output signals of the low band power amplifier. Lead frame finger 26''' is electrically coupled to a point on the ground plane 22 of the lead frame 16 between the two power amplifiers 14a, 14b via a large looping bond wire 24'''. The distal end of the lead finger 26''' is coupled to ground of the PCB 10.

The intense magnetic fields generated around the output bond wires of the low band power amplifier will set up circulating currents in the ground loop positioned between the two power amplifiers, thus diminishing the coupling of those intense magnetic fields onto the more distant output bond wires 24a' of the high band power amplifier 14a.

Figure 6:
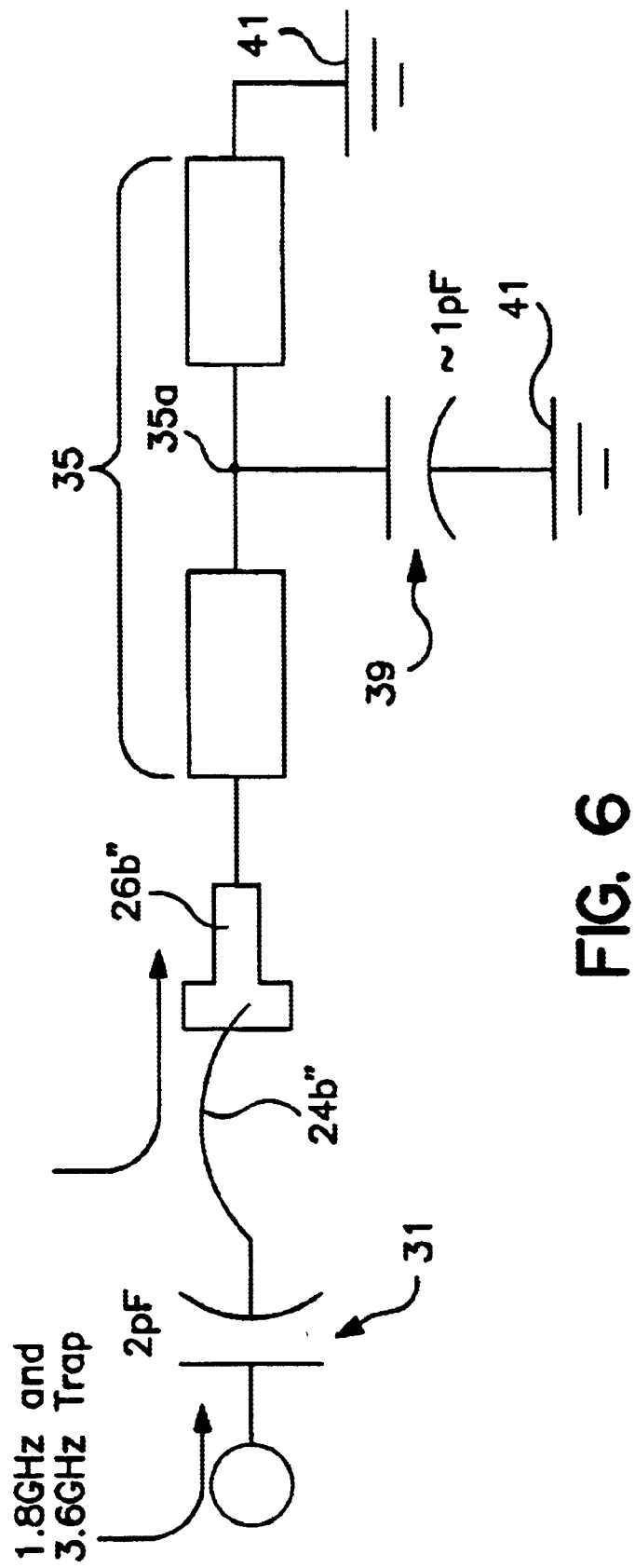
FIG. 6 is a circuit diagram of a second and fourth harmonic trap in accordance with another embodiment of the present invention.

We also have determined that the isolation between the two power amplifiers can be further improved by designing the harmonic trap circuit to trap both the second and the fourth harmonics of the low band amplifier. FIG. 6 is a schematic circuit diagram illustrating a second embodiment of the harmonic trap circuit that is designed to trap signals at both the second and fourth harmonics of the low band amplifier, e.g., at about 1.8 GHz and at about 3.6 GHz. The aspects of the harmonic trap in accordance with the circuit diagram of FIG. 6 are also shown in the plan view of FIG. 2.

In this embodiment, a second capacitor 39 is placed on the PCB 10 electrically coupled between an intermediate point 35a along the length of the transmission line 35 and ground 41. The exact point intermediate the length of the transmission line and the exact capacitance value of the capacitor should be selected to provide the precise LC circuit characteristics needed to trap the desired frequencies. In the particular embodiment described herein, in which the fundamental frequency of the low band amplifier is about 900 MHz and the desired fourth harmonic trap frequency is about 3.6 GHz, the second capacitor 39 has a value of approximately 1 pF and the transmission line is 8 mils wide and about 200 mils in length with the second capacitor 39 tapped at about the middle of that length.

Figure 7:
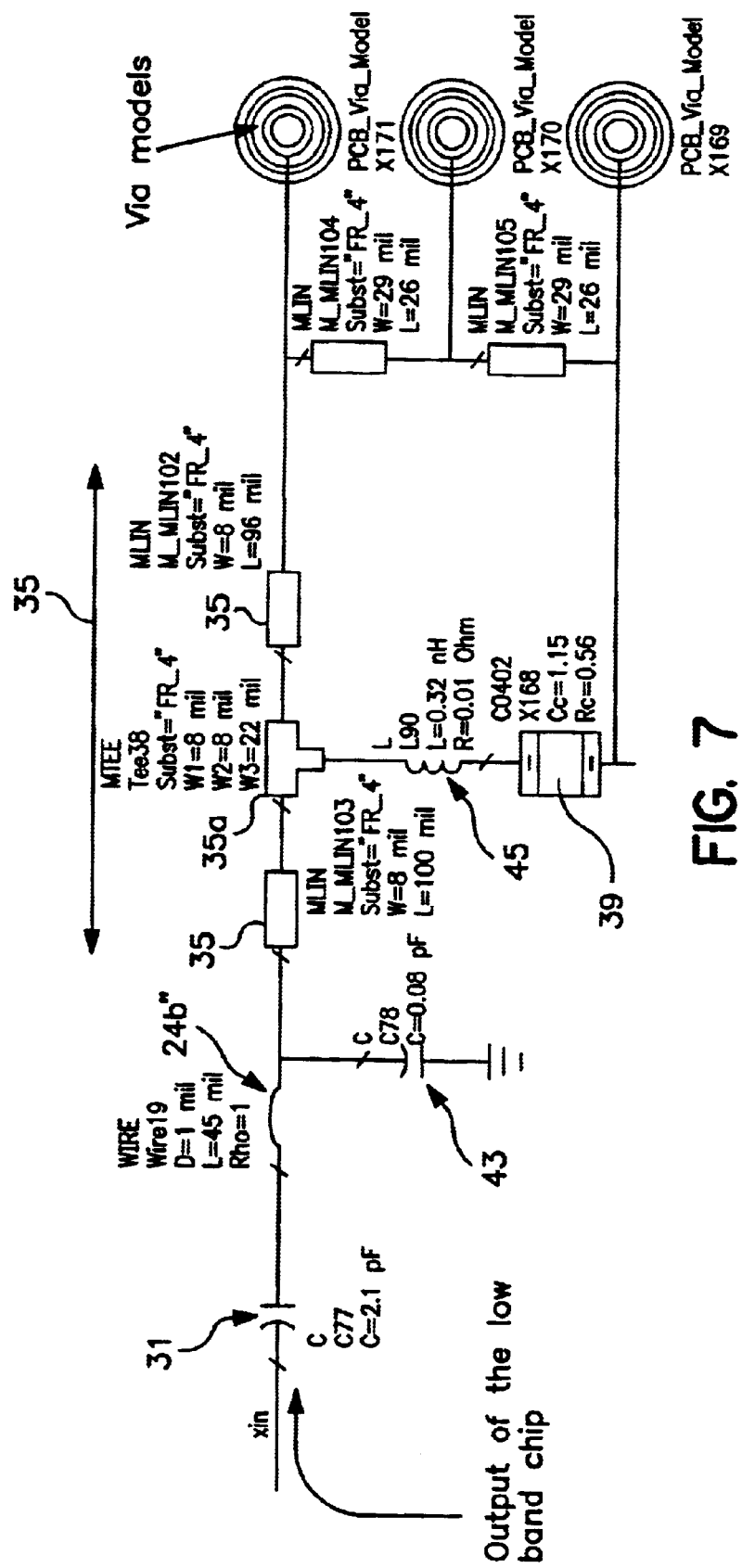
FIG. 7 is a more detailed circuit diagram of the second and fourth harmonic trap shown in FIG. 5.

FIG. 7 is a more detailed circuit diagram illustrating one specific detailed circuit model of the dual resonant second and fourth harmonic trap circuit of FIG. 6 showing details such as inherent parasitic reactances (see, e.g., capacitance 43 and inductance 45) of the package materials and dimensions.

Having thus described a few particular embodiments of the invention, various alterations, modifications, and improvements will readily occur to those skilled in the art. Such alterations, modifications and improvements as are made obvious by this disclosure are intended to be part of this description through not expressly stated herein, and are intended to be within the spirit and scope of the invention. Accordingly, the foregoing description is by way of example only, and not limiting the invention is limited only as defined in the following claims and equivalents thereto.

We claim:

1. A dual band power amplifier circuit comprising:
    a first power amplifier adapted to amplify signals in a first fundamental frequency band and having an output coupled to a first output conductor;
    a second power amplifier adapted to amplify signals in a second fundamental frequency band higher than said first fundamental frequency band and having an output coupled to a second output conductor; and
    a dual resonant harmonic trap circuit coupled to the output of the first power amplifier adapted to trap signals at a second harmonic of said first fundamental frequency and a fourth harmonic of said first fundamental frequency.

2. The dual band power amplifier circuit of claim 1 wherein said dual resonant harmonic trap circuit comprises a first capacitor having a first terminal coupled to said output of said first amplifier and a second terminal, a transmission line coupled between said second terminal of said capacitor and ground of said dual band power amplifier circuit and a second capacitor having a first terminal coupled to an intermediate point in said transmission line and a second terminal coupled to ground.

3. The dual band power amplifier circuit of claim 2 wherein said first and second power amplifiers are formed on an integrated circuit die, said integrated circuit die being attached to a substrate and wherein said first capacitor is formed on said integrated circuit die and said transmission line and said second capacitor are formed on said substrate.

4. The dual band power amplifier circuit of claim 3 wherein said integrated circuit die comprises first and second dies on which said first and second amplifiers are disposed, respectively.

5. The dual band power amplifier circuit of claim 3 wherein said first capacitor and said transmission line are connected via at least one bond wire between said die and said substrate.

6. The dual band power amplifier circuit of claim 5 further comprising a lead frame disposed between said die and said substrate, said lead frame having at least one lead finger, said at least one bond wire coupled between said die and said at least one lead finger of said lead frame and said at least one lead finger coupled to said transmission line on said substrate.

7. The dual band power amplifier circuit of claim 6 wherein said substrate is a printed circuit board.

8. The dual band power amplifier circuit of claim 6 wherein said lead frame is 5 mm square.

9. The dual band power amplifier circuit of claim 3 wherein said transmission line has a high Q.

10. The dual band power amplifier circuit of claim 3 wherein said first capacitor and said length of said transmission line are selected to provide a capacitance and an inductance, respectively, so as to form an LC circuit that will trap signals at said second harmonic frequency.

11. The dual band power amplifier circuit of claim 10 wherein said second capacitor and said intermediate point of said transmission line are selected to provide a capacitance and an inductance, respectively, so as to form an LC circuit that will trap signals at said fourth harmonic frequency.

12. The dual band power amplifier circuit of claim 1 further comprising a ground loop positioned between said output conductor of said first amplifier and said output conductor of said second power amplifier.

13. The dual band power amplifier circuit of claim 12 wherein said dual resonant harmonic trap circuit comprises a first capacitor having a first terminal coupled to said output of said first amplifier and a second terminal, a transmission line coupled between said second terminal of said capacitor and ground of said dual band power amplifier circuit and a second capacitor having a first terminal coupled to an intermediate point in said transmission line and a second terminal coupled to ground.

14. The dual band power amplifier circuit of claim 12 wherein said output conductor of said first amplifier and said output conductor of said second amplifier are parallel and adjacent to each other and said ground loop comprises a conductor disposed parallel to said output conductor of said first amplifier and said output conductor of said second amplifier and disposed between said output conductors of said first and second power amplifiers.

15. The dual band power amplifier circuit of claim 14 wherein said output conductors of said first and second amplifiers comprise bond wires and said ground loop comprises a bond wire disposed parallel to and between said output conductors of said first and second power amplifiers.

16. The dual band power amplifier circuit of claim 15 further comprising a lead frame having a plurality of lead fingers and wherein said first and second amplifiers are formed on an integrated circuit die mounted on said lead frame, and said bond wires electrically couple between said die and said lead fingers, said lead frame being disposed between said die and a substrate.

17. The dual band power amplifier circuit of claim 16 wherein said lead frame comprises a ground plane disposed between said first and second amplifiers and said bond wire of said ground loop is coupled between said ground plane of said lead frame and a lead finger of said lead frame, and said lead finger to which said ground loop bond wire is coupled is further coupled to a ground of said substrate.

18. The dual band power amplifier circuit of 17 wherein said bond wires forming said output conductors comprise a plurality of bond wires for each of said first and second power amplifiers.

19. The dual band power amplifier circuit of claim 17 wherein said dual resonant harmonic trap circuit comprises a first capacitor having a first terminal coupled to said output of said first amplifier and a second terminal, a transmission line coupled between said second terminal of said terminal of said capacitor and ground of said dual band power amplifier circuit and a second capacitor having a first terminal coupled to an intermediate point in said transmission line and a second terminal coupled to ground.

20. The dual band power amplifier circuit of claim 19 wherein said first point in said integrated circuit and said transmission line and said second capacitor are formed on said substrate.

* * * * *